US006184159B1

(12) United States Patent
Lou et al.

(10) Patent No.: US 6,184,159 B1
(45) **Date of Patent: *Feb. 6, 2001**

(54) INTERLAYER DIELECTRIC PLANARIZATION PROCESS

(75) Inventors: Chine-Gie Lou, Hsinchu Hsien; Horng-Ming Lee, Chang-Hwa, both of (TW)

(73) Assignee: Taiwan Semiconductor Manufacturing Corporation, Hsinchu (TW)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/096,901

(22) Filed: Jun. 12, 1998

(51) Int. Cl.[7] .................... H01L 21/4763; H01L 21/461; H01L 21/469

(52) U.S. Cl. .......................... 438/791; 438/623; 438/624; 438/637; 438/691; 438/780

(58) Field of Search .................................... 438/624, 623, 438/626, 637, 691, 787, 791, 780

(56) References Cited

U.S. PATENT DOCUMENTS

| | | | | |
|---|---|---|---|---|
| 5,291,058 | * | 3/1994 | Samata et al. | 257/641 |
| 5,312,512 | * | 5/1994 | Allman et al. | 156/636 |
| 5,413,962 | * | 5/1995 | Lur et al. | 437/195 |
| 5,674,783 | * | 10/1997 | Jang et al. | 438/697 |
| 5,716,890 | * | 2/1998 | Yao | 438/624 |
| 5,817,571 | * | 10/1998 | Yu et al. | 438/622 |
| 5,858,882 | * | 1/1999 | Chang et al. | 438/761 |
| 6,027,995 | * | 2/2000 | Chiang et al. | 438/623 |

* cited by examiner

*Primary Examiner*—John F. Niebling
*Assistant Examiner*—Ha Tran Nguyen
(74) *Attorney, Agent, or Firm*—Blakely Sokoloff Taylor & Zafman

(57) ABSTRACT

A method of forming a planar interlayer dielectric layer over underlying structures is disclosed. First, a liner oxide layer is formed over the underlying structures. Then, a BPSG layer is formed over the liner oxide layer. The BPSG layer is polished and a cap oxide layer is formed over the BPSG layer. Finally, a nitride layer is formed over the cap oxide layer.

2 Claims, 3 Drawing Sheets

INTERLAYER DIELECTRIC PLANARIZATION PROCESS

TECHNICAL FIELD OF THE INVENTION

This invention relates to semiconductor manufacturing processes, and more particularly, to a method for forming an interlayer dielectric.

BACKGROUND OF THE INVENTION

Interlayer and intermetal dielectric layers are commonly used to isolate conducting structures, such as metal layers, from subsequently deposited conducting layers. The term interlayer dielectric layer generally refers to the insulative layer between the semiconductor substrate and the first metal layer. The term intermetal dielectric layer generally refers to the insulative layer between metal layers.

Intermetal dielectric layers are also useful in performing a planarization function. A typical prior art process for forming an intermetal dielectric layer consists of depositing multiple layers of oxide over the underlying metal layer. For example, a layer of silicon dioxide first covers the metal layer, followed by a low dielectric constant (k) material, followed by a second layer of silicon dioxide. The low k material is used because of its ability to minimize the capacitive "RC time delay constant" between metal lines. The multiple layers of oxide are then patterned and etched to form via holes.

However, it is found that this prior art intermetal dielectric suffers from metal ion diffusion. Specifically, for an intermetal dielectric layer, the low k material used exhibits poor thermal conductivity. What is needed is a new method for forming an interlayer dielectric that will enhance thermal conductivity while maintaining a low RC time delay constant.

SUMMARY OF THE INVENTION

A method of forming a planar interlayer dielectric layer over underlying structures is disclosed. The method comprises the steps of: forming a liner oxide layer over the underlying structures; forming a BPSG layer over the liner oxide layer; polishing said BPSG layer; forming a cap oxide layer over the BPSG layer; and forming a nitride barrier layer over the cap oxide layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
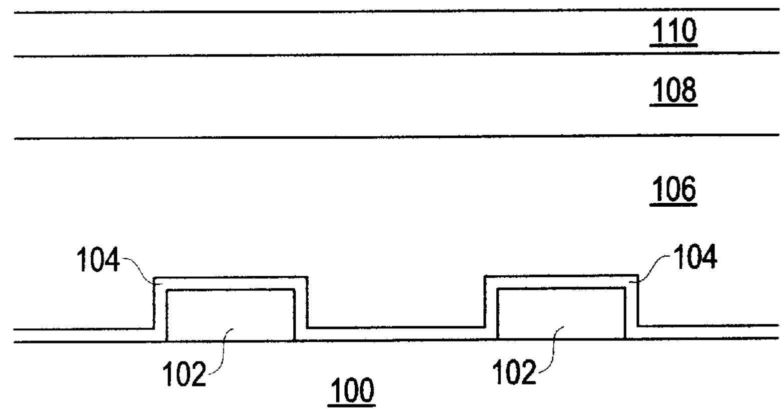
FIGS. 1–5 are cross-sectional views of a semiconductor substrate illustrating the steps of the present invention.

Turning to FIG. 1, a substrate 100 has a plurality of structures 102 formed thereon. The term "substrate" is understood to possibly include a semiconductor wafer, active and passive devices formed within the wafer, and layers formed on the wafer's surface. Thus, the term "substrate" is meant to include devices formed within a semiconductor wafer and the layers overlying the wafer.

The structures 102 may be, for example, polysilicon gates of MOSFET transistors. Thus, it can be appreciated that the structures 102 shown in FIG. 1 is merely exemplary and not meant to be limiting.

In accordance with the present invention, as a first step, a liner oxide layer 104 is deposited over the substrate 100 and the structures 102. The liner oxide layer 104 is preferably silicon dioxide, has a thickness of about 500–1500 angstroms, and is preferably formed using a conventional CVD technique. The liner oxide layer 104 serves the purpose of providing a high quality insulator directly over and in immediate contact with the structures 102.

Next, a layer of borophosphosilicateglass (BPSG) 106 is deposited onto the liner oxide layer 104 using conventional CVD techniques. The BPSG layer 106 is preferably about 2000–8000 angstroms thick. Alternatively, the BPSG layer 106 may be substituted therefore by any of the other well known materials, such as PSG. After the BPSG layer 106 is deposited, a planarization process, preferably chemical mechanical polishing (CMP), is performed to improve the global planarization of the BPSG layer 106.

Next, a cap oxide layer 108 is deposited. The cap oxide layer 108 is preferably silicon dioxide. The thickness of the cap oxide layer 108 is between 1000–4000 angstroms, and is preferably formed using a conventional CVD technique. The cap oxide layer 108 serves the purpose of providing a high quality insulator.

Next, a barrier layer 110 is deposited over the cap oxide layer 108. The barrier layer 110 is preferably formed from a barrier nitride layer ($Si_xN_y$) $Si_3N_4$, and has a thickness of 300–1500 angstroms. The $Si_3N_4$ layer 110 is formed using a conventional CVD technique.

Figure 2:
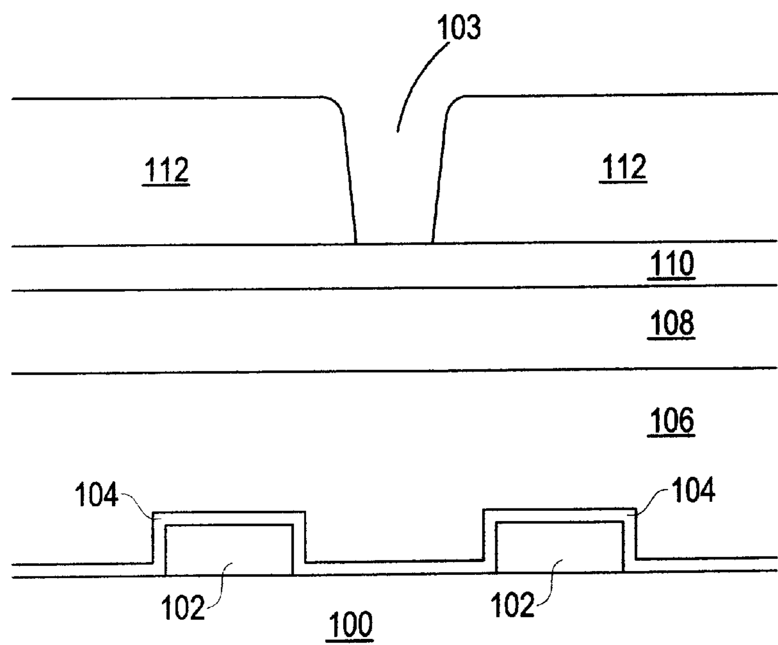

Turning to FIG. 2, after the $Si_3N_4$ layer 110 has been deposited, a photoresist layer 112 is coated over the $Si_3N_4$ layer 110. The photoresist layer 112 is patterned and developed to leave an opening 103. The opening 103 will, after further processing described below, be transformed into contact holes.

Specifically, the $Si_3N_4$ layer 110, the cap oxide layer 108, the BPSG layer 106, and the liner oxide 104 are etched away using the photoresist layer 112 as a mask. It is preferable that an anisotropic reactive ion etching be used to remove the $Si_3N_4$ layer 110, the cap oxide layer 108, the BPSG layer 106, and the liner oxide 104. Because of the $Si_3N_4$ layer 110, a two-step two-chemistry RIE etching may be necessary. The resulting structure is a contact hole formed through the $Si_3N_4$ layer 110 and the oxide layers 108, 106, and 104. The contact hole may lead to, for example, the source or drain of a MOSFET transistor.

Figure 3:
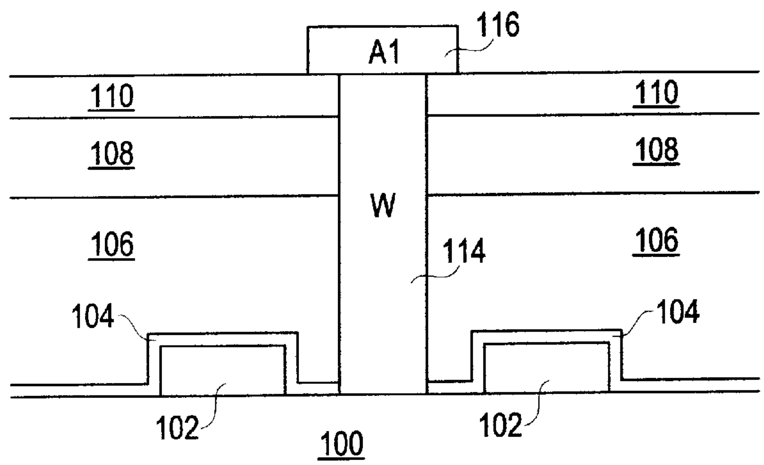

Turning to FIG. 3, a tungsten plug 114 is formed in the contact hole using either CVD or sputtering techniques. Next, an aluminum layer 116 is formed over the tungsten plug 114 using conventional techniques. For example, an aluminum layer may be formed using PVD techniques. Next, the aluminum layer 116 is patterned and etched.

Figure 4:
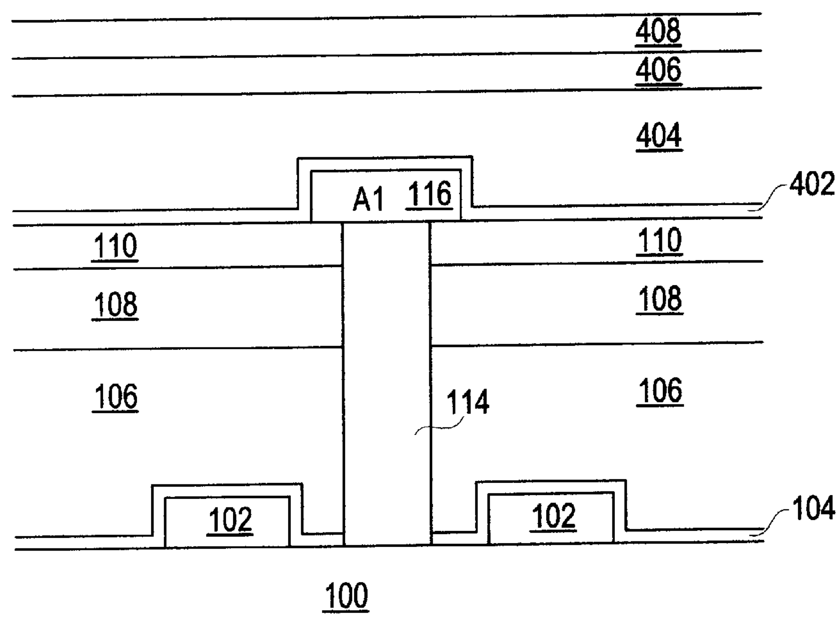

To see how the process of the present invention can further be applied, FIG. 4 illustrates further processing. Specifically, a second liner oxide 402 having preferably a thickness of between 500 to 1500 angstroms is deposited over the aluminum line 116 and the $Si_3N_4$ layer 110. Next, a low dielectric (k) layer 404 preferably having a thickness of 3000 to 8000 angstroms is formed over the second liner oxide layer 402. The low dielectric layer may be, for example, polymer.

Atop the low dielectric layer 404 is formed a second cap oxide layer 406. The cap oxide layer 406 is preferably silicon dioxide formed to a thickness of 2000 to 6000 angstroms. The second cap oxide layer 406 is then polished using a CMP process. Finally, a second barrier nitride layer 408 is deposited over the second cap oxide layer 406. Preferably, the second barrier nitride layer 408 is formed using a conventional CVD technique.

Figure 5:
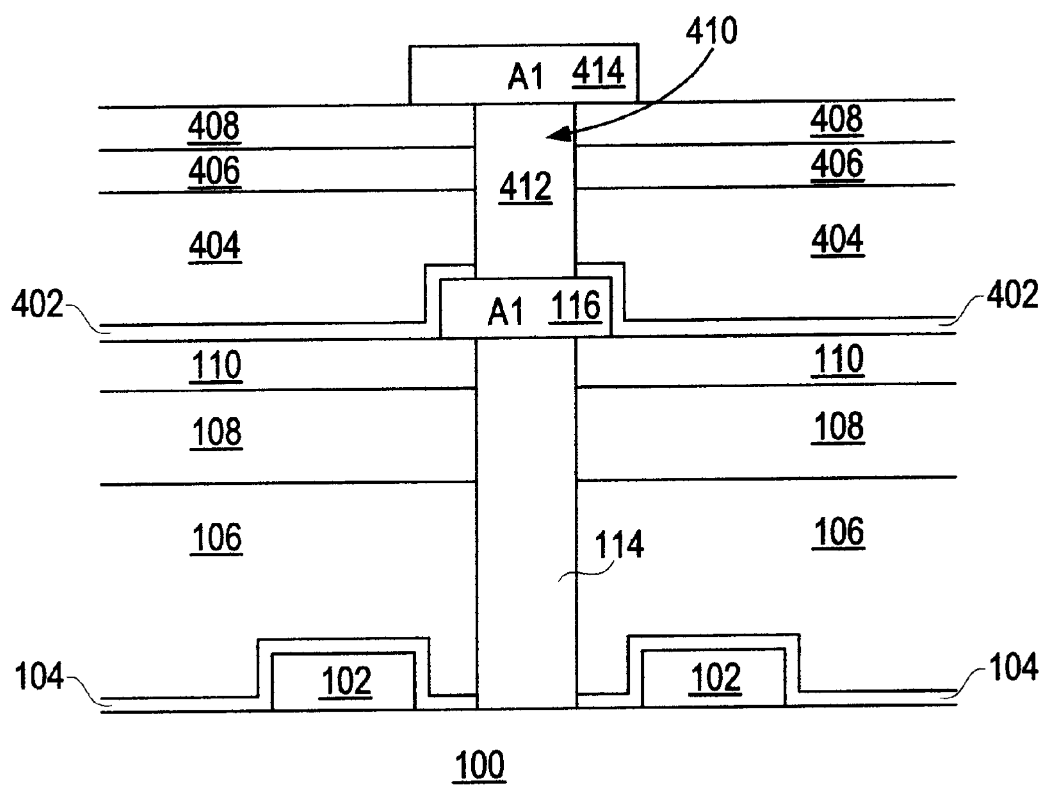

Turning to FIG. 5, a via opening 410 is formed in the second barrier nitride layer 408, second cap oxide layer 406, low dielectric layer 404, and second liner layer 402. A second tungsten plug 412 is formed in the via opening 410. Finally, a second aluminum line 414 is formed atop the second tungsten plug 412.

It has been found that the interlayer dielectric layer thus formed from the liner oxide 104, the BPSG 106, the cap oxide 108, and the SiN layer 110 exhibits many advantages. Similarly, the intermetal dielectric layer formed from the liner oxide 402, the low k layer 404, the cap oxide layer 406, and the barrier nitride layer 408 also exhibits advantages over the prior art. First, experimental results indicate that the conductive areas (414 and 116) are more reliable due to greater thermal conductivity from the $Si_3N_4$ layers underneath the conductive layers. Specifically, computer simulations indicate that temperature of the conductive layers is decreased as compared to the prior art. Second, metal ion diffusion is minimized. Third, the process of the present invention is relatively simple and low cost.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of forming a planar interlayer dielectric layer over underlying structures, the method comprising:

forming a liner oxide layer over the underlying structures;

forming a BPSG layer over the liner oxide layer;

planarizing said BPSG layer;

forming a cap oxide layer over the BPSG layer;

forming a heat dissipating layer formed from silicon nitride ($Si_3N_4$) over the cap oxide layer, said heat dissipating layer being between 300 and 1500 angstroms thick;

forming a contact hole through said heat dissipating layer, said cap oxide layer, said BPSG layer, and said liner oxide layer down to the underlying structures;

forming a tungsten plug in said contact hole; and forming a conductive structure over said tungsten plug and said heat dissipating layer;

wherein said heat dissipating layer acts to conduct heat away from said conductive structure into said underlying structures.

2. The method of claim 1 further including the steps of forming an intermetal dielectric layer by:

forming a second liner oxide layer over said conductive structure;

forming a low dielectric constant (k) layer over the second liner oxide layer;

forming a second cap oxide layer over the low k layer;

planarizing said second cap oxide layer, and forming a second nitride barrier layer over the second cap oxide layer.

* * * * *